(12) United States Patent
Tanaka

(10) Patent No.: US 7,576,424 B2
(45) Date of Patent: Aug. 18, 2009

(54) SEMICONDUCTOR DEVICE

(75) Inventor: Shuichi Tanaka, Chino (JP)

(73) Assignee: Seiko Epson Corporation (JP)

( * ) Notice: Subject to any disclaimer, the term of this patent is extended or adjusted under 35 U.S.C. 154(b) by 17 days.

(21) Appl. No.: 11/497,578

(22) Filed: Aug. 2, 2006

(65) Prior Publication Data

US 2007/0029672 A1 Feb. 8, 2007

(30) Foreign Application Priority Data

Aug. 3, 2005 (JP) .............................. 2005-225452

(51) Int. Cl.
H01L 23/48 (2006.01)

(52) U.S. Cl. ................. 257/700; 257/734; 257/737; 257/786; 257/E23.019; 257/E23.02; 257/E23.06

(58) Field of Classification Search ................. 257/700, 257/734, 737, 786, E23.019, E23.02, E23.06
See application file for complete search history.

(56) References Cited

U.S. PATENT DOCUMENTS

| 5,877,556 | A | * | 3/1999 | Jeng et al. .................... 257/737 |
| 6,051,489 | A | * | 4/2000 | Young et al. ................. 438/612 |
| 6,097,091 | A | * | 8/2000 | Ohsumi ....................... 257/758 |
| 6,624,504 | B1 | * | 9/2003 | Inoue et al. .................. 257/668 |
| 6,759,311 | B2 | * | 7/2004 | Eldridge et al. ............. 438/460 |
| 6,847,107 | B2 | * | 1/2005 | Fjelstad et al. .............. 257/690 |
| 7,098,127 | B2 | * | 8/2006 | Ito .............................. 438/614 |
| 2001/0003049 | A1 | | 6/2001 | Fukasawa et al. |
| 2002/0130412 | A1 | * | 9/2002 | Nagai et al. .................. 257/737 |
| 2005/0275115 | A1 | * | 12/2005 | Tanaka et al. ............... 257/786 |

FOREIGN PATENT DOCUMENTS

| JP | 02-272737 | 11/1990 |
| JP | 5-144823 | 6/1993 |
| JP | 09-321181 | 12/1997 |
| JP | 2001-110831 | 4/2001 |
| JP | 2002-231765 | 8/2002 |
| JP | 2005-109110 | 4/2005 |
| JP | 2005-136402 | 5/2005 |
| KR | 10-2003-0097909 | 12/2003 |

* cited by examiner

Primary Examiner—Eugene Lee
Assistant Examiner—Peniel M Gumedzoe
(74) Attorney, Agent, or Firm—Harness, Dickey & Pierce, P.L.C.

(57) ABSTRACT

A semiconductor device including: a semiconductor substrate on which a plurality of electrodes are formed; a plurality of resin protrusions formed on the semiconductor substrate, arranged along a straight line, and extending in a direction which intersects the straight line; and a plurality of electrical connection sections formed on the resin protrusions and electrically connected to the electrodes.

3 Claims, 4 Drawing Sheets

SEMICONDUCTOR DEVICE

Japanese Patent Application No. 2005-225452, filed on Aug. 3, 2005, is hereby incorporated by reference in its entirety.

BACKGROUND OF THE INVENTION

The present invention relates to a semiconductor device.

An electronic module has been known in which a semiconductor device is mounted on an interconnect substrate (e.g. JP-A-2-272737). In order to manufacture a highly reliable electronic module, it is important to electrically connect an interconnect pattern of the interconnect substrate with electrical connection sections of the semiconductor device.

SUMMARY

According to one aspect of the invention, there is provided a semiconductor device comprising:

a semiconductor substrate on which a plurality of electrodes are formed;

a plurality of resin protrusions formed on the semiconductor substrate, arranged along a straight line, and extending in a direction which intersects the straight line; and a plurality of electrical connection sections formed on the resin protrusions and electrically connected to the electrodes.

DETAILED DESCRIPTION OF THE EMBODIMENT

The invention may provide a semiconductor device exhibiting excellent mounting capability.

(1) According to one embodiment of the invention, there is provided a semiconductor device comprising:

a semiconductor substrate on which a plurality of electrodes are formed;

a plurality of resin protrusions formed on the semiconductor substrate, arranged along a straight line, and extending in a direction which intersects the straight line; and a plurality of electrical connection sections formed on the resin protrusions and electrically connected to the electrodes.

According to this embodiment, a semiconductor device exhibiting excellent mounting capability can be provided.

(2) In this semiconductor device, each of the resin protrusions may extend to diagonally intersects the straight line.

(3) In this semiconductor device, each of the resin protrusions may extend to perpendicularly intersect the straight line.

(4) In this semiconductor device, the semiconductor substrate may be a semiconductor chip; and the straight line may extend along a side of a surface of the semiconductor substrate on which the electrodes are formed.

(5) In this semiconductor device, the surface of the semiconductor substrate on which the electrodes are formed may be rectangular; and the straight line may extend along a long side of the rectangular surface.

(6) In this semiconductor device, the electrical connection sections may be formed on each of the resin protrusions.

Embodiments to which the invention is applied are described below with reference to the drawings. Note that the invention is not limited to the following embodiments. The invention also includes a configuration in which the following embodiments and modifications are arbitrarily combined.

Figure 1A:
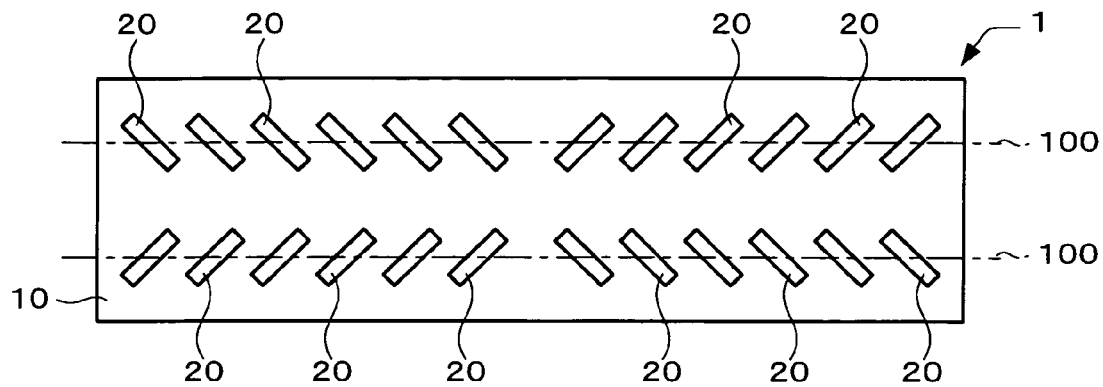
FIGS. 1A to 1C are views illustrative of a semiconductor device according to an embodiment of the invention.
Figure 1B:
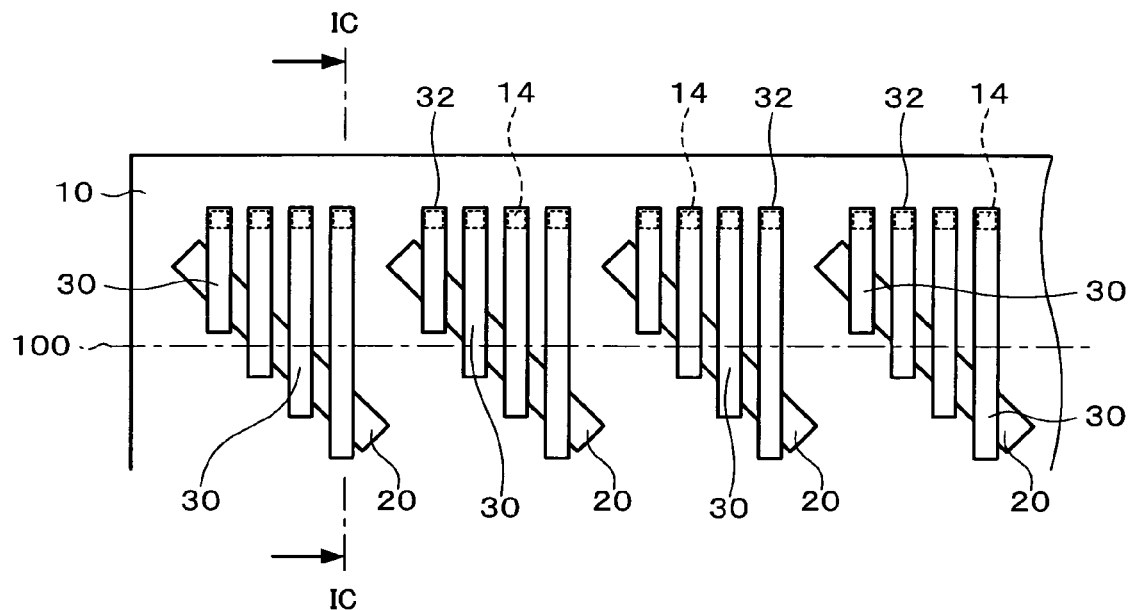
Figure 1C:
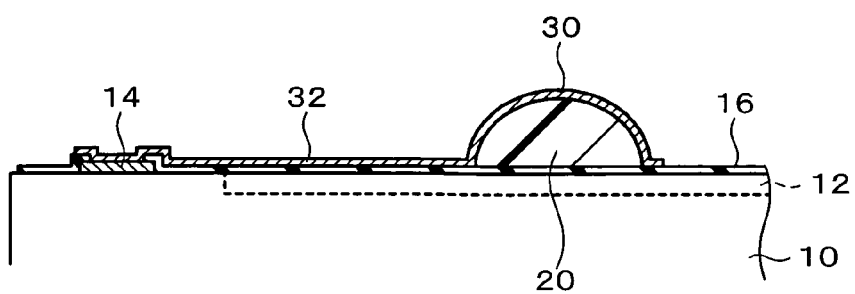
Figure 2A:
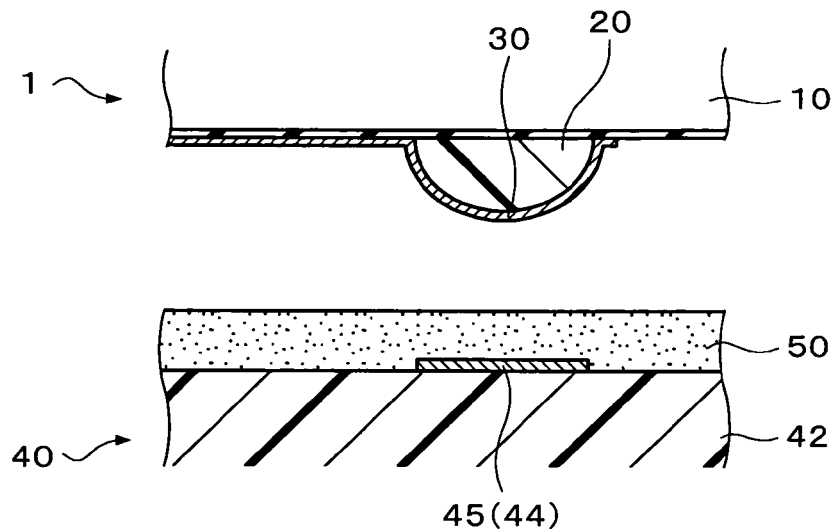
FIGS. 2A to 2C are views illustrative of a semiconductor device according to an embodiment of the invention.
Figure 2B:
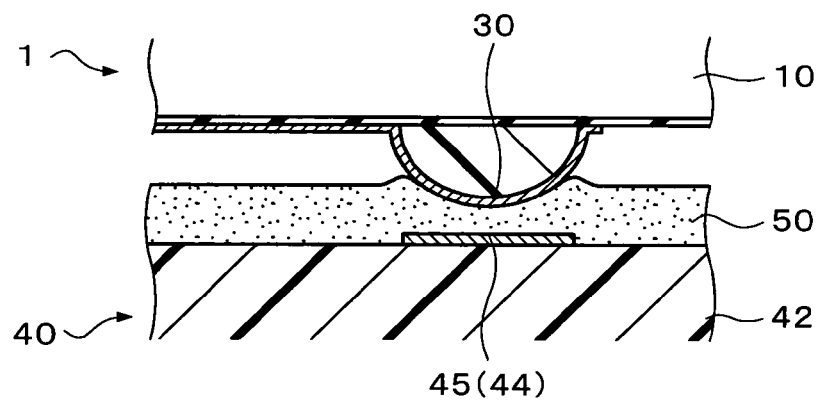
Figure 2C:
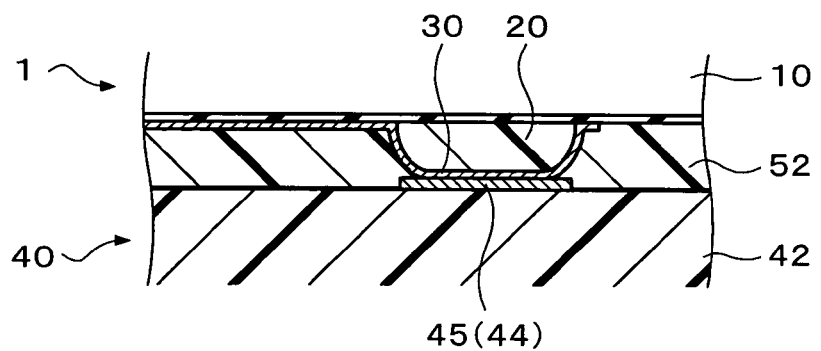
Figure 3:
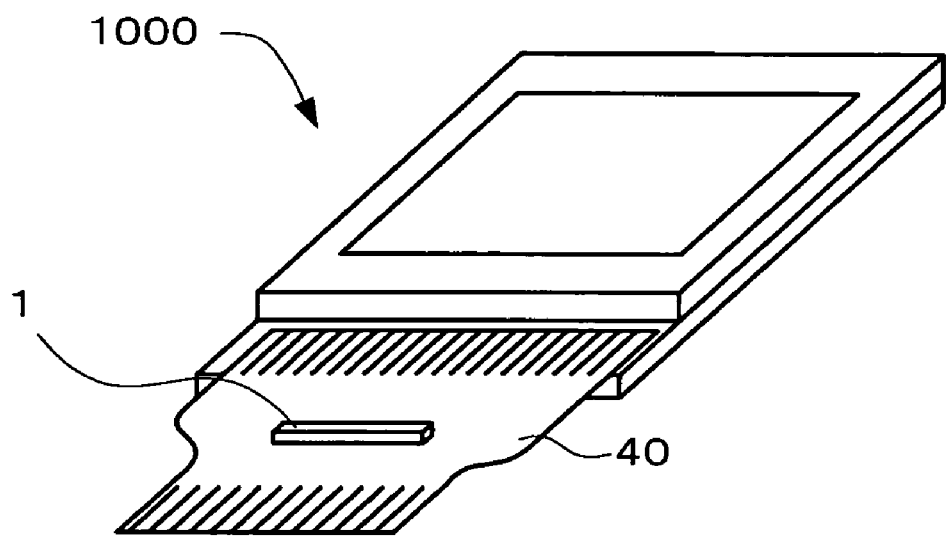
FIG. 3 is a view illustrative of a semiconductor device according to an embodiment of the invention.

FIGS. 1 to 3 are views illustrative of a semiconductor device according to an embodiment to which the invention is applied. FIG. 1A is a top view of a semiconductor device 1 according to an embodiment to which the invention is applied. In FIG. 1A, an electrode 14 and an electrical connection section 30 (interconnect 32) are omitted for convenience of illustration. FIG. 1B is a partially enlarged view of FIG. 1A, and FIG. 1C is a cross-sectional view along the line IC-IC in FIG. 1B.

The semiconductor device according to this embodiment includes a semiconductor substrate 10. The semiconductor substrate 10 may be a silicon substrate, for example. The semiconductor substrate 10 may be in the shape of a chip, as shown in FIG. 1A. Specifically, the semiconductor substrate 10 may be a semiconductor chip. The semiconductor substrate 10 may be in the shape of a wafer (not shown). In this case, the semiconductor substrate 10 may include regions in which semiconductor chips (semiconductor devices) are respectively formed. An integrated circuit 12 may be formed on the semiconductor substrate 10 (see FIG. 1C). The configuration of the integrated circuit 12 is not particularly limited. For example, the integrated circuit 12 may include an active element such as a transistor and a passive element such as a resistor, coil, or capacitor. When the semiconductor substrate 10 is in the shape of a chip, the surface (active surface) of the semiconductor substrate 10 on which the integrated circuit 12 is formed may be rectangular (see FIG. 1A). The active surface of the semiconductor substrate 10 may be square (not shown).

As shown in FIGS. 1B and 1C, a plurality of electrodes 14 are formed on the semiconductor substrate 10. The electrode 14 may be formed on the surface (active surface) of the semiconductor substrate 10 on which the integrated circuit 12 is formed, for example. The electrodes 14 may be arranged along one side of the semiconductor substrate 10. The electrodes 14 may be arranged along a plurality of sides of the semiconductor substrate 10. When the active surface of the semiconductor substrate 10 is rectangular, the electrodes 14 may be arranged on (only) two long sides of the active surface. The semiconductor device may also include electrodes arranged along the short side of the active surface of the semiconductor substrate 10 (not shown). The electrodes 14 may be arranged in one row along one side of the semiconductor substrate 10. The electrodes 14 may be arranged in a plurality of rows along one side of the semiconductor substrate 10 (not shown).

The electrode 14 may be electrically connected with the integrated circuit 12. A conductor which is not electrically connected with the integrated circuit 12 may also be referred to as the electrode 14. The electrode 14 may be part of an internal interconnect (electrode) of the semiconductor substrate. The electrode 14 may be formed of a metal such as aluminum or copper.

As shown in FIG. 1C, the semiconductor substrate 10 may include a passivation film 16. The passivation film 16 may be formed to expose the electrode 14. The passivation film 16 may have an opening which exposes the electrode 14. The passivation film may be an inorganic insulating film formed of $SiO_2$, SiN, or the like. The passivation film 16 may be an organic insulating film formed of a polyimide resin or the like.

As shown in FIGS. 1A to 1C, the semiconductor device according to this embodiment includes a plurality of resin protrusions 20. The resin protrusion 20 is formed on the semiconductor substrate 10. The resin protrusions 20 are arranged along one straight line 100. Specifically, the semiconductor device according to this embodiment may include a plurality of resin protrusions 20 which may be divided into groups, each of the groups including the resin protrusions 20 arranged along the straight line 100. In this case, the resin protrusions 20 may be provided so that the resin protrusions 20 are divided into one or more groups. The straight line 100 may be a straight line which extends along one side of the external shape of the semiconductor substrate 10 (semiconductor chip). When the external shape of the surface of the semiconductor substrate 10 on which the electrode is formed is rectangular, the straight line 100 may extend along the long side of the surface of the semiconductor substrate 10. Specifically, the resin protrusions 20 may be arranged along the long side of the semiconductor chip. The resin protrusions 20 may be arranged at intervals.

Each resin protrusion 20 has a shape extending along the direction which intersects the straight line 100. As shown in FIGS. 1A and 1B, the resin protrusion 20 may have such a shape that the resin protrusion 20 diagonally intersect the straight line 100. The resin protrusion 20 may have such a shape that the resin protrusion 20 extends along a straight line radially extending from the center of the semiconductor substrate 10 (semiconductor chip).

The material for the resin protrusion 20 is not particularly limited. A known material may be used as the material for the resin protrusion 20. For example, the resin protrusion 20 may be formed using a resin such as a polyimide resin, silicone-modified polyimide resin, epoxy resin, silicone-modified epoxy resin, benzocyclobutene (BCB), polybenzoxazole (PBO), or phenol resin.

The semiconductor device according to this embodiment includes a plurality of electrical connection sections 30. The electrical connection section 30 is formed on the resin protrusion 20. In this case, a plurality of electrical connection sections 30 may be formed on one resin protrusion 20 (see FIG. 1B). Or, only one electrical connection section 30 may be formed on one resin protrusion 20 (not shown). The electrical connection section 30 may be respectively electrically connected with the electrode 14. For example, the electrical connection section 30 may refer to part (region covering the resin protrusion 20) of an interconnect 32 pulled out from the electrode 14 and extending over the resin protrusion 20. In this case, the electrical connection section 30 may refer to part of the interconnect 32 used as an external terminal. The interconnect 32 may be formed to contact the semiconductor substrate 10 (passivation film 16) on both sides of the resin protrusion 20. The interconnect 30 may extend in the direction which intersects the straight line 100.

The structure and the material for the interconnect 32 (electrical connection section 30) are not particularly limited. For example, the interconnect 32 may be formed of a single layer. The interconnect 32 may be formed of a plurality of layers. In this case, the interconnect 32 may include a first layer formed of titanium tungsten and a second layer formed of gold (not shown).

The semiconductor device 1 according to this embodiment may have the above-described configuration. According to the semiconductor device 1, a semiconductor device exhibiting excellent mounting capability can be provided. Specifically, according to the semiconductor device 1, a highly reliable electronic module 1000 (see FIG. 3) can be efficiently manufactured. The effects of the semiconductor device 1 are described below.

A method of mounting the semiconductor device 1 on an interconnect substrate 40 is not particularly limited. An example of the mounting method is described below with reference to FIGS. 2A to 2C. The interconnect substrate 40 is described below. The interconnect substrate 40 may include a base substrate 42 and an interconnect pattern 44. The material for the base substrate 42 is not particularly limited. The material for the base substrate 42 may be an organic or inorganic material, or may be an organic-inorganic composite material. A substrate formed of an inorganic material may be used as the base substrate 42. In this case, the base substrate 42 may be a ceramic substrate or a glass substrate. When the base substrate 42 is a glass substrate, the interconnect substrate 40 may be part of an electro-optical panel (e.g. liquid crystal panel or electroluminescent panel). The interconnection pattern 44 may be formed of a metal film or a metal compound film such as indium tin oxide (ITO), Cr, or Al, or a composite of such films. The interconnection pattern 44 may be electrically connected with an electrode which drives a liquid crystal (e.g. scan electrode, signal electrode, or common electrode). The base substrate 42 may be a substrate or a film formed of polyethylene terephthalate (PET). A flexible substrate formed of a polyimide resin may be used as the base substrate 42. As the flexible substrate, a tape used in a flexible printed circuit (FPC) or tape automated bonding (TAB) technology may be used. In this case, the interconnect pattern 44 may be formed by stacking any of copper (Cu), chromium (Cr), titanium (Ti), nickel (Ni), and titanium tungsten (Ti—W), for example. The interconnect pattern 44 includes an electrical connection section 45. The electrical connection section 45 is the part of the interconnect pattern 44 used for electrical connection with another member. The interconnect pattern 44 may be formed to partially extend inside the base substrate 42 (not shown).

A step of mounting the semiconductor device 1 on the interconnect substrate 40 is described below. As shown in FIG. 2A, the semiconductor device 1 is disposed on the interconnect substrate 40 and positioned so that the electrical connection section 30 (resin protrusion 20) of the semiconductor device 1 faces the interconnect pattern 44 (electrical connection section 45) of the interconnect substrate 40. In this case, an adhesive 50 may be provided between the semiconductor device 1 and the interconnect substrate 40. As shown in FIG. 2A, the adhesive 50 may be provided on the interconnect substrate 40. A film-shaped adhesive may be used as the adhesive 50, for example. A paste adhesive may also be used as the adhesive 50. The adhesive 50 may be an insulating adhesive. The adhesive 50 may be a resin adhesive. As shown in FIG. 2B, the semiconductor device 1 is pressed against the interconnect substrate 40. In this step, the adhesive 50 may be caused to flow utilizing the resin protrusion 20 (see FIG. 2B).

The electrical connection section 30 is caused to contact the interconnect pattern 44 (electrical connection section 45) (see FIG. 2C). This step may be performed with heating. In this case, the flowability of the adhesive 50 is increased. In this step, the resin protrusion 20 may be crushed between the semiconductor substrate 10 and the interconnect substrate 40 to elastically deform the resin protrusion 20 (see FIG. 2C). This allows the electrical connection section 30 to be pressed against the electrical connection section 45 (interconnect pattern 44) due to the elastic force of the resin protrusion 20, whereby an electronic module exhibiting high electrical connection reliability can be manufactured. The adhesive 50 may be cured to form an adhesive layer 52, as shown in FIG. 2C. The interval between the semiconductor substrate 10 and the interconnect substrate 40 may be maintained using the adhesive layer 52. Specifically, the elastically deformed state of the resin protrusion 20 may be maintained using the adhesive layer 52. For example, the resin protrusion 20 may be maintained in an elastically deformed state by curing the adhesive 50 in a state in which the resin protrusion 20 is crushed.

The semiconductor device 1 may be mounted on the interconnect substrate 40 by the above steps. An inspection step and the like may be further performed to obtain the electronic module 1000 shown in FIG. 3. The electronic module 1000 may be a display device. The display device may be a liquid crystal display device, an electroluminescent (EL) display device, or the like. The semiconductor device 1 (semiconductor substrate 10) may be a driver IC which controls the display device.

In the step of mounting the semiconductor device 1 on the interconnect substrate 40, when providing the adhesive 50 in advance between the semiconductor device 1 and the interconnect substrate 40, the adhesive 50 is caused to flow utilizing the resin protrusion 20 (electrical connection section 30), as described above. In order to electrically connect the electrical connection section 30 of the semiconductor device 1 with the interconnect pattern 44 (electrical connection section 45), it is important to mount the semiconductor device 1 so that the adhesive 50 does not remain between the electrical connection section 30 and the electrical connection section 45. In other words, if the adhesive 50 can be efficiently removed from the space between the electrical connection section 30 and the electrical connection section 45 in the step of mounting the semiconductor device 1 on the interconnect substrate 40, a highly reliable electronic module can be efficiently manufactured. Specifically, a highly reliable electronic module can be efficiently manufactured by efficiently causing the adhesive 50 to flow between the semiconductor device 1 and the interconnect substrate 40.

As described above, the semiconductor device 1 includes the resin protrusions 20 arranged along the straight line 100. The resin protrusion 20 extends along the direction which intersects the straight line 100. Accordingly, the semiconductor device 1 allows the adhesive 50 to easily flow in the direction which intersects the straight line 100. In more detail, the semiconductor device 1 allows the adhesive 50 to flow between two adjacent resin protrusions 20. Specifically, the adhesive 50 flows between the resin protrusions 20 in the direction which intersects the straight line 100. The resin protrusion 20 extends along the direction which intersects the straight line 100. Therefore, when the adhesive 50 flows in the direction which intersects the straight line 100, the adhesive 50 flows along the resin protrusion 20. Specifically, the flow direction of the adhesive 50 is controlled by the resin protrusion 20. Therefore, the semiconductor device 1 reduces the flow resistance of the adhesive 50 during mounting. According to the semiconductor device 1, the adhesive 50 rarely remains between the resin protrusion 20 and the interconnect substrate 40 (electrical connection section 45) during mounting, whereby the electrical connection section 30 and the electrical connection section 45 can be reliably electrically connected. Moreover, since the flow resistance of the adhesive 50 is reduced, the semiconductor device 1 can be efficiently mounted.

Specifically, the semiconductor device according to this embodiment allows provision of a semiconductor device which allows efficient manufacture of a highly reliable electronic module.

Figure 4:
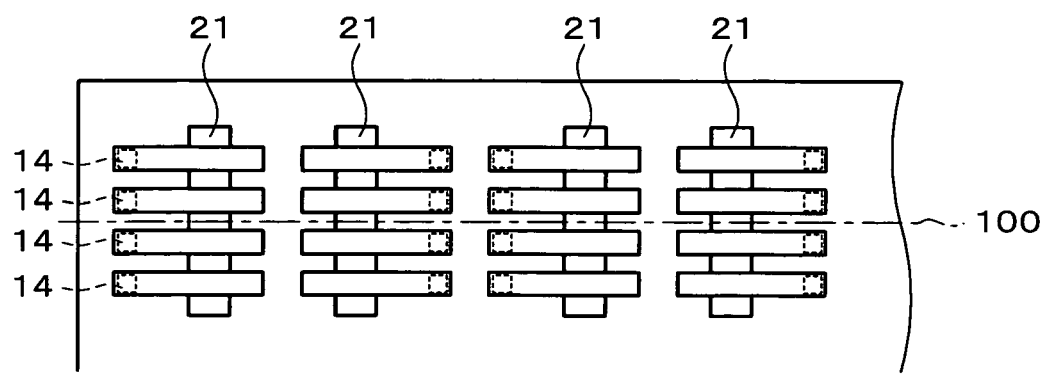
FIG. 4 is a view illustrative of a semiconductor device according to a modification of an embodiment of the invention.
Figure 5:
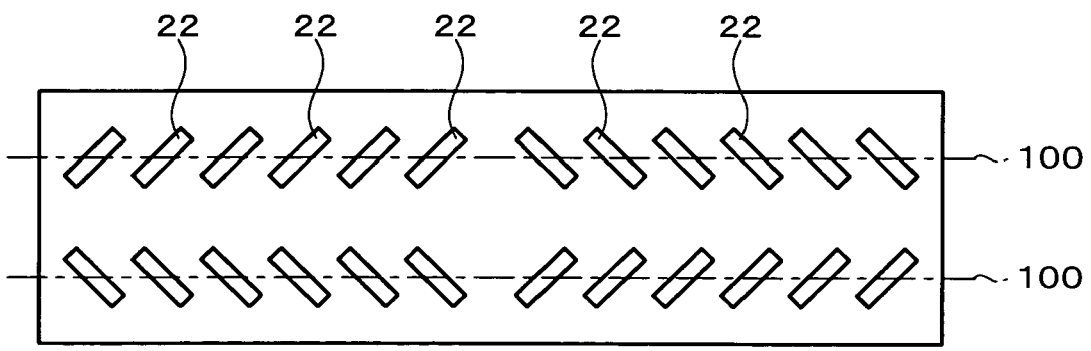
FIG. 5 is a view illustrative of a semiconductor device according to a modification of an embodiment of the invention.

FIGS. 4 and 5 are views illustrative of semiconductor devices according to modifications of an embodiment to which the invention is applied.

In the example shown in FIG. 4, a resin protrusion 21 extends perpendicularly to the straight line 100. In the example shown in FIG. 4, the electrodes 14 may be arranged along the direction which intersects the straight line 100. In other words, the electrodes 14 may be disposed so that the electrodes 14 are divided into a plurality of groups, in which the electrodes 14 are arranged in parallel along the direction which intersects the straight line 100. In this case, each group may be formed of a plurality of electrodes 14 arranged in parallel with the resin protrusion 21.

In the example shown in FIG. 5, a resin protrusion 22 extends along a tangent direction of virtual circles or ellipses (not shown) of which the centers coincide with the intersecting point of the diagonal lines of the semiconductor substrate 10.

The effects of the semiconductor device 1 can also obtained by these semiconductor devices. Therefore, a highly reliable electronic module can be efficiently manufactured.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A semiconductor device comprising:
a semiconductor substrate on which a plurality of electrodes are formed and on which a passivation film is formed to expose the electrodes, the plurality of electrodes being arranged in a direction of a straight line which extends along a side of a surface of the semiconductor substrate on which the electrodes are formed;
a plurality of resin protrusions formed on the passivation film, the plurality of resin protrusions arranged side by side along the straight line, each of the resin protrusions extending in a direction which is parallel to the surface of the semiconductor substrate and diagonally intersects the straight line, a longitudinal axis of the resin protrusions diagonally intersecting the straight line; and a plurality of groups of interconnects that are electrically connected to and extend from the electrodes, the plurality of groups of interconnects having electrical connection sections formed on the resin protrusions, each of the resin protrusions having one group of the interconnects formed thereon, each of the interconnects having a first portion and a second portion, the first portion formed on a first area of the passivation film, the second portion formed on a second area of the passivation film, the first and second areas located on opposite sides across one of the resin protrusions.

2. The semiconductor device as defined in claim 1, wherein the semiconductor substrate is a semiconductor chip.

3. The semiconductor device as defined in claim 2, wherein the surface of the semiconductor substrate on which the electrode are formed is rectangular; and wherein the straight line extends along a long side of the rectangular surface.

* * * * *